(12) United States Patent
Gaidis et al.

(10) Patent No.: US 7,033,881 B2
(45) Date of Patent: Apr. 25, 2006

(54) METHOD FOR FABRICATING MAGNETIC FIELD CONCENTRATORS AS LINERS AROUND CONDUCTIVE WIRES IN MICROELECTRONIC DEVICES

(75) Inventors: Michael C. Gaidis, Wappingers Falls, NY (US); Phillip L. Trouilloud, Norwood, NJ (US); Sivananda K. Kanakasabapathy, Hopewell Junction, NY (US); David W. Abraham, Croton, NY (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 10/710,044

(22) Filed: Jun. 15, 2004

(65) Prior Publication Data

US 2005/0274997 A1 Dec. 15, 2005

(51) Int. Cl.
 *H01L 21/8242* (2006.01)

(52) U.S. Cl. .................. 438/238; 365/158; 365/171; 438/3

(58) Field of Classification Search .............. 438/3, 438/238

See application file for complete search history.

(56) References Cited

U.S. PATENT DOCUMENTS

| 6,261,893 B1 * | 7/2001 | Chang et al. ............... 438/238 |
| 6,559,511 B1 | 5/2003 | Rizzo |
| 6,865,107 B1 * | 3/2005 | Anthony et al. ............ 365/171 |

* cited by examiner

*Primary Examiner*—David Nelms
*Assistant Examiner*—Dao H. Nguyen
(74) *Attorney, Agent, or Firm*—Eric W. Petraske

(57) ABSTRACT

In an MRAM cell, the writing current is encased in a low-reluctance material that is treated in one of several ways to render the material closest to the storage element ineffective to carry magnetic flux, thereby establishing a horseshoe-shaped cross section that focuses the flux toward the storage element.

22 Claims, 3 Drawing Sheets

METHOD FOR FABRICATING MAGNETIC FIELD CONCENTRATORS AS LINERS AROUND CONDUCTIVE WIRES IN MICROELECTRONIC DEVICES

BACKGROUND OF INVENTION

The present invention relates generally to magnetic devices in microelectronic circuits, and, more particularly, to magnetic field concentrators for magnetic random access memory devices and method of forming the same.

Magnetic random access memory (MRAM) is a non-volatile memory technology that offers substantial benefits in many applications over traditional memories such as dynamic random access memory (DRAM) and flash memory. The speed of MRAM devices, combined with the non-volatile nature of its storage will eventually allow for "instant on" systems that come to life as soon as the system is turned on. This saves the time and electrical power consumed in transferring boot data from a slow non-volatile memory into faster memory capable of supporting a microprocessor.

The magnetic memory element in the most promising MRAM devices is realized as a magnetic tunnel junction (MTJ). The MTJ is a structure having ferromagnetic layers separated by a thin insulating tunnel barrier. Digital information is stored and represented in the memory element as directions of magnetization vectors in the magnetic layers. More specifically, the magnetic moment of one magnetic layer (the "reference" layer) is fixed or pinned, while the magnetic moment of the other magnetic layer (the "free" layer) may be switched between the parallel direction and the antiparallel direction with respect to the fixed magnetization direction of the reference layer. Depending on the state of the free layer (parallel or antiparallel), the magnetic memory element exhibits two different resistance values: low resistance for parallel, and high resistance for antiparallel. Accordingly, detection of the value of resistance allows an MRAM device to provide information stored in the memory element.

The free layer magnetization direction is adjusted to be parallel or antiparallel through the use of a magnetic field strong enough to reorient it without being strong enough to affect the orientation of the reference layer magnetization. In conventional MRAM devices, this so-called "write" field is generated by driving current through on-chip conductive wires ("write" wires). Typically, generating fields sufficient to switch the free layer requires undesirably large amounts of current, as the on-chip wires may be a significant distance from the magnetic layers, and a large portion of the generated flux is lost to regions away from the magnetic layers.

One improvement to this situation is through the use of additional magnetic films surrounding portions of the write wires to provide a low reluctance path for focussing the magnetic flux on the MTJ free layer. A compromise between manufacturability and flux focussing efficiency typically dictates that the low reluctance path be made as a horseshoe-shaped (in cross-section) liner of high permeability magnetic material surrounding the write wire on all sides but the side facing the MTJ. (U.S. Pat. No. 6,559,511, N. Rizzo, "Narrow Gap Cladding Field Enhancement for Low Power Programming of a MRAM Device") The magnetic flux surrounding the write wire can thus be focussed to escape primarily in the desired direction—towards the free layer.

There exist significant manufacturing complexities in physically realizing such magnetic liners in microelectronic circuitry, particularly for wires residing above the MTJ films (where the horseshoe opening points down). The most common method suitable for scaling to small dimensions (deep submicron) involves the following processing steps: 1) etch a trench in the dielectric film which will encase the write wire, 2) deposit magnetic liner material to coat the sidewalls, and undesirably, the bottom of the trench, 3) anisotropically etch the liner material to remove preferentially the liner material at the bottom of the trench, while leaving the sidewall liner largely intact, 4) deposit the write wire conductor (e.g., copper) and pattern with e.g., a Damascene technique, and 5) cap the wire with electroless-plated magnetic liner material. The most difficult process in this sequence is step number 3, anisotropically etching to remove the liner material at the bottom of the trench without substantially modifying the material on the sidewalls.

Methods of patterning or modifying certain magnetic films in another application (not in a "magnetic liner" application) without explicit etching have been demonstrated recently. These include ion implantation into the magnetic materials "Track Width Definition of Giant Magnetoresistive Sensors by Ion Irradiation," by Liesl Folks et al., IEEE Transactions on Magnetics, vol 37, No. 4, July 2001, pp 1730–1732, "Localized Magnetic Modification of Permalloy Using Cr+ Ion Implantation," by Liesl Folks et al., J. Phys. D: Appl. Phys., vol 36, November 2003, pp. 2601–2604 and oxidation of the magnetic materials "Magnetic Tunnel Junction Pattern Technique," by Eugene Chen et al., J. Appl. Phys., vol 93, No. 10, May 2003, pp. 8379–8381. These methods have not been used to date for patterning films in magnetic liner applications.

The industry would benefit greatly from an improved method of removing the magnetic liner material at the bottom of trenches, so as to be able to more efficiently create magnetic liner shapes that focus the write fields onto the free layer of MTJs.

SUMMARY OF INVENTION

The invention relates to a method of fabricating a magnetic memory cell in which magnetic liners on the write wire have specific shapes tailored by modifying the magnetic properties of certain portions of the liner, rather than by etching the portions away.

A feature of the invention is that the portions of the liner that are desired to be removed are left physically in place, but are modified by reducing the magnetic moment of the undesired material by modifying the material or through addition of elements.

Another feature of the invention is adding additional layers to saturate the magnetization of the undesired material in such a way that it is effectively non-responsive to the higher-frequency currents that affect MRAM "write" operations.

BRIEF DESCRIPTION OF DRAWINGS

Referring to the exemplary drawings wherein like elements are numbered alike in the several figures.

DETAILED DESCRIPTION

The following discussion describes a method of forming magnetic liners in which specific shapes can be tailored by modifying the magnetic properties of certain portions of the liner, rather than by etching the portions away.

Figure 1:
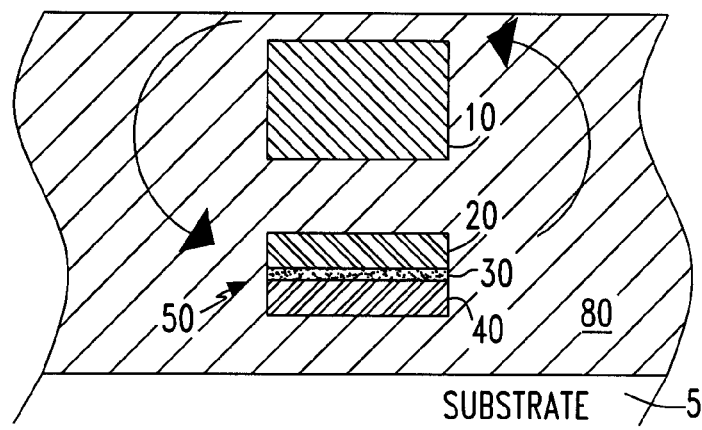
FIG. 1 is a cross-sectional view of a prior art MTJ device with write wire above the MTJ.

Referring initially to FIG. 1, a cross-sectional view is shown of a representative magnetic memory cell structure according to the current state of the art, to assist in revealing the improvements to be gained with the present invention. In FIG. 1, item 50 refers collectively to the group of layers making up the MTJ. Typically, item 40 would be a reference layer of a material such as a bilayer of 3 nm CoFe atop 10 nm IrMn, item 30 is the tunnel barrier of a material such as aluminum oxide, 1 nm thick, and item 20 is the free layer such as NiFe, 4 nm thick. Item 10 is a conductive wire in cross-section (i.e., extending into and out of the page) that is used to create a magnetic field for changing the magnetization direction of the free layer ("writing the bit"). Item 10 will be referred to generally as a "write element". The arrows in the figure represent magnetic fields generated by currents traveling out of the page, along the conductive wire. It should be noted that, although a MTJ device is used to demonstrate the need for such write fields, this invention is not limited to MTJ devices. Other structures could be used in place of the MTJ and would benefit from the invention for generating concentrated fields from the conductive wire. MTJ 50 and similar elements will be referred to as "sensing elements" in the claims. For simplicity in illustration, the conductors that are used to read the state of the MTJ device are not shown. They may, for example, be in front of or behind the plane of the paper. Write element 10 is said to be oriented with respect to MTJ 50, meaning that the magnetic field of the write element passes through the sensing element as much as practical. In the example shown, the axis of the write element is parallel to the axis of the MTJ, both are perpendicular to the plane of the paper and the side of the write element facing the sensing element is as close as can be arranged.

As is known in the art, the magnitude of current passing through the MTJ 50 depends on the orientation of the magnetic moment of free layer 20 relative to the orientation of the magnetic moment of reference layer 40. The material surrounding the cell is an inter-layer dielectric, such as silicon oxide (SiO2) or a low-k material such as SiCOH. Conventional diffusion barrier layers that prevent diffusion of copper are omitted from the Figure, as are adhesion layers that are conventionally used to improve the adhesion of one material to another.

Figure 2:
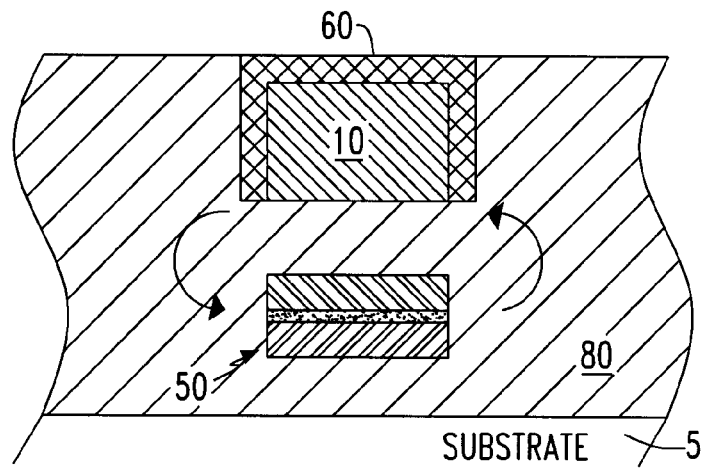
FIG. 2 is a similar cross-section in a cell showing a nearly-ideal shape for the magnetic liner such that it focuses the field towards the MTJ.

Now referring to FIG. 2, a more preferable structure is represented, showing a cell having a write wire 10 disposed above sensing element 50 that is encapsulated with a low-reluctance film 60 along all but one face of the wire (the bottom face toward the MTJ). The low-reluctance magnetic liner 60 is used to focus the magnetic field at the MTJ 50. For clarity, diffusion barrier liners around the wire in this and subsequent figures are not shown, but are intended where necessary to prevent degradation of device properties with temperature or time. The low reluctance material 60 will be referred to as a magnetic concentrating material, since it concentrates the magnetic flux within it and at the bottom side of conductor 10 (which will be referred to as the first side). The top side of element 10 will be referred to as the second side and the sides on the left and right will be referred to as the connecting sides.

The liner acts to increase the magnetic field on the MTJ for a given amount of current through the conductive wire 10. Alternatively, a similar magnetic field can be created with a significantly smaller current when the liner is implemented. This can reduce power consumption of the microelectronic circuit being used to apply fields to devices, which has much importance in the industry. The challenge is in how to cost-effectively create such a liner structure, and is particularly difficult when the liner is placed around a wire located above the MTJ. Simpler processing is available for wires located below the MTJ.

The structure in FIG. 2 represents a simplified form of a desired structure. The following discussion shows the inventive method of achieving such a desired structure. The arrows in FIG. 2 are located extending between the write wire and the MTJ, indicating that the magnetic field is concentrated around the MTJ structure 50.

Figure 3:
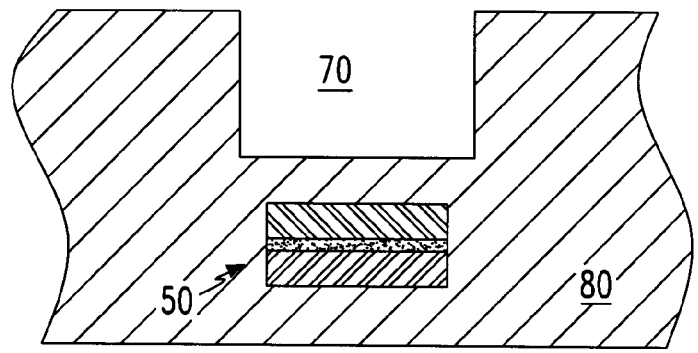
FIG. 3 shows the starting point for manufacturing such a magnetic liner: with a trench etched in the dielectric layer encapsulating the MTJ.

FIG. 3 shows the starting point for manufacturing such a magnetic liner according to the invention: a trench 70 is etched in the dielectric layer 80 that will have a wire formed in a Damascene process. Dielectric 80 has been formed conventionally, encapsulating the MTJ 50 and any previous layers of circuitry. Material 80 may be a low-k material or a conventional oxide dielectric.

Figure 4:
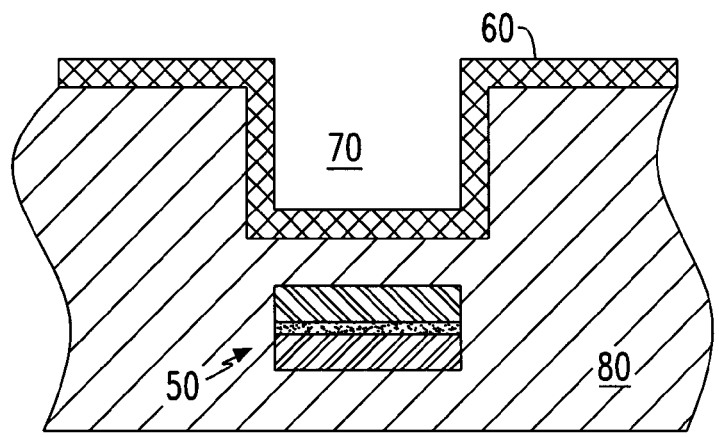
FIG. 4 shows the structure after deposition of the low-reluctance magnetic liner film.

FIG. 4 illustrates the next step: deposition of the low-reluctance magnetic liner 60 in a blanket manner over the entire wafer. This can be done by one of several methods, such as plasma vapor deposition (PVD), chemical vapor deposition (CVD), ion-beam assisted deposition (IBD), or atomic layer deposition (ALD), to name several. The exact method of liner deposition is not critical. The process will be tuned as is known in the art to increase the amount of material deposited on the vertical walls of the trench. Note that, although not explicitly shown in these figures, diffusion barrier layers and adhesion-promoting layers may be required depending on the material being used for the liner. Liner materials may be chosen from the group CoFe, CoFeB, or NiFe in alloys with atomic fractions that result in ferromagnetism, and including others with suitable properties for use as a low-reluctance liner. Suitable materials will have a value for the reluctance below a "reluctance threshold", meaning a value of reluctance that is suitable for this purpose. The thickness of material 60 on the vertical sides will preferably be greater than 10 nm. The actual value will depend on a tradeoff between the sensitivity of the sensing element 50 and the amount of space available for the conductor in the write element. Diffusion and adhesion layers may be chosen from the group TaN, Ta, TiN, Ru, and including others with suitable properties for use as diffusion barriers and adhesion promoters. For purposes of the claims, the material 60 will be referred to as being "adjacent" to the conductor 10, whether or not there is a diffusion barrier or an adhesion layer present. The preferred embodiment would use a TaN/Ta barrier bilayer followed by NiFe as the low-reluctance liner material.

After the processing step represented in FIG. 4, two methods of forming a structure effectively similar to that of FIG. 2 are disclosed in this invention. While the goal of this invention is to remove the horizontal portion of layer 60 inside the trench from the magnetic "circuit" without removing it physically, the modes of doing so include two main approaches: 1) damaging or impregnating the horizontal portion of the layer to raise its reluctance and therefore disable its ability to respond to the magnetic field of the write element, and 2) adding additional layers of material to saturate the concentrating material so that it does not respond to the wire-generated fields.

Figure 5:
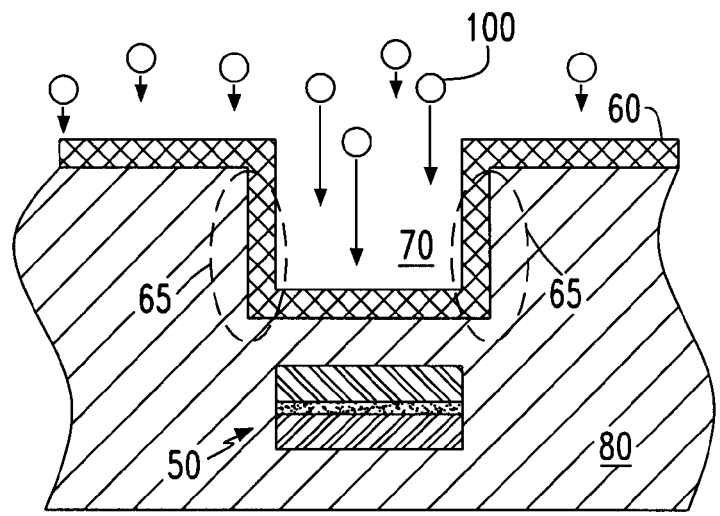
FIG. 5 shows the first of two preferred methods for deactivating the magnetic liner at the base of the trench.

FIG. 5 shows the first of two preferred methods for deactivating the magnetic liner at the base of the trench: damaging the film or adding elements via ion implantation to reduce the magnetic moment of the material. A layer of low reluctance material that has been treated according to the invention to raise its reluctance will be said to be "disabled" or to have its reluctance raised above the reluctance threshold.

The first method is diagramed in FIG. 5, where the use of a directional implantation or damaging mechanism is used. With proper substrate bias, plasma, thermal, or field-generated charged particles 100 (electrons or ions such as charged argon or oxygen), can easily be accelerated to impart a certain directionality to the impinging particles that will cause them to impact on the horizontal surfaces to a much greater extent than vertical surfaces. This mechanism can be used to selectively damage the material (e.g. by breaking bonds) or to change the composition of the materials on the horizontal surfaces while leaving the vertical sidewall material 65 largely intact. Through suitable choice of impinging particle, it is possible to damage the horizontal material's crystal structure to the extent that it no longer holds significant magnetization, and is no longer part of the low-reluctance magnetic circuit.

Alternatively, impregnating the material with an element such as oxygen, argon, xenon, krypton, carbon, fluorine, boron, phosphorus, arsenic, germanium, gallium, indium, and nitrogencan render it nonmagnetic as well, for the same effect; i.e. will raise its reluctance above the reluctance threshold so that it does not contribute effectively to the magnetic circuit. The sidewall material 65 will still maintain its magnetic properties, i.e. low reluctance, and will be an effective liner for field focusing. The completion of the conductive wire structure is discussed below, with reference to FIG. 8.

Figure 6:
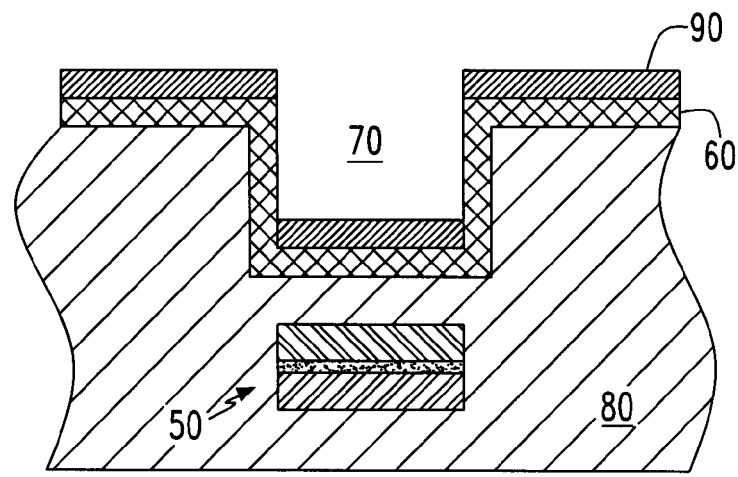
FIG. 6 shows one version of the second of two preferred methods for deactivating the magnetic liner at the base of the trench.

A first embodiment of the second method (adding additional layers to deactivate undesired liner material) is diagramed in FIG. 6. FIG. 6 shows one version of the second of two preferred methods for deactivating or disabling the magnetic liner at the base of the trench: "pinning" the liner at the base of the trench with an antiferromagnet 90 deposited adjacent to the liner material. The term pinning is used routinely in the field to indicate that the magnetic moment of the material in question is strongly resistant to being changed by an applied magnetic field. Note that the antiferromagnet could also be deposited before the magnetic liner film 60. In either case, the antiferromagnet would be anisotropically deposited so that the bottom of the trench is more thickly covered than the sidewalls, and the sidewalls would have so little material that the antiferromagnetic pinning would be ineffective. The direction of the magnetic moment of the pinning material is preferably into or out of the page so as not to saturate the magnetization of the unpinned liner material.

With conventional implementation of clean interfaces, appropriate crystal growth can be promoted atop the low-reluctance liner material such that one can deposit an antiferromagnet 90 such as platinum manganese (PtMn) or iridium manganese (IrMn), or one of several others, in intimate contact with the liner.

After annealing the sample in a magnetic field, the orientation of the antiferromagnet is set in a preferred direction, and will in turn provide a very strong pinning mechanism to fix the orientation of the liner material upon which it is deposited. Once pinned in such a manner, the liner material will no longer respond as a low-reluctance path for the magnetic field generated by switching currents in the conductive wire; i.e. the current in the write wire will generate a magnetic field in the bottom layer 60 that is too low to overcome the effect of layer 90.

For the intended implementation, only the horizontal surface of the low-reluctance liner closest to the sensing element need be deactivated with the antiferromagnet pinning mechanism. This is readily achieved through the use of an anisotropic deposition of the antiferromagnet that places a relatively large amount of material on the horizontal surfaces.

Using well-known techniques such as collimated PVD or ion-beam deposition, it is possible to obtain very large ratios of deposited antiferromagnet thickness between horizontal and vertical surfaces. For thin antiferromagnet layers (of order 5 nm or less), the pinning of the antiferromagnet will be ineffective, so some sidewall deposition can be tolerated. The foregoing is an advantageous feature of the invention, since a clean-up etch to remove the antiferromagnetic material from the vertical sides will not be needed. The intended thickness of the antiferromagnet on the horizontal surfaces, including the bottom of the trench, is greater than 5 nm, but generally not greater than 40 nm. The reason is to maintain the overall conductivity of the write wire at a high value by maximizing the fraction of low-resistance material (e.g., copper or aluminum) in the trench.

The annealing of layer 90 to "set" the antiferromagnetic pinning direction is preferred to be along the long axis of the conductive wire (i.e., into or out of the page with respect to FIG. 6) to prevent saturation of the magnetization in the liner material on the sidewalls, and to reduce the offset fields which may be generated on the MTJ device immediately below the wire. Typically, layer 90 is annealed at 300 deg C. for 30 minutes in a field of 1 Tesla.

Alternatively, some applications may benefit from such an offset field, in which case the pinning can be oriented in any desired direction, so long as the desired regions of active liner 60 do not become saturated and ineffective as low-reluctance liners. In either case, the direction at which the pinned film magnetization is set can be chosen by the manufacturer, and this will provide a means of knowing the preferred direction of magnetization in the sidewalls of the liner film. It is a common problem with the state of the art that the magnetization points preferably along the long axis of the wire (due to demagnetization field effects), but in an unknown direction. For example, one wire may have magnetization pointing into the page while the adjacent wire may have magnetization pointing out of the page. It can be important to know this direction, as any compensation required for the MTJ devices will require knowledge of the direction and magnitude of the offset field generated by the liner around the wire. Low-reluctance liner schemes that do not rely on such a pinning mechanism as the one described in this invention may be subject to undesired and potentially random flipping of the direction of magnetization in the liner.

Figure 7:
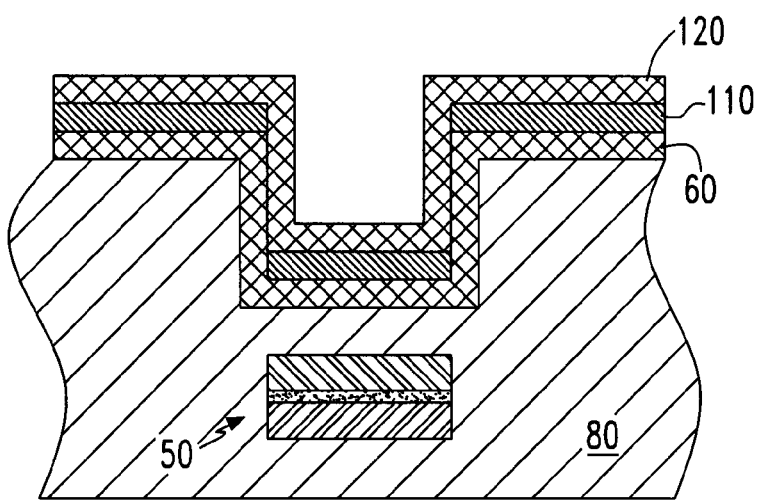
FIG. 7 shows a second version of the second of two preferred methods for deactivating the magnetic liner at the base of the trench.

A second embodiment of the second method (adding additional layers to deactivate undesired liner material) is illustrated in FIG. 7, showing a method for deactivating the magnetic liner at the base of the trench by effectively saturating the magnetization of the film at the base of the trench by creating an artificial antiferromagnet through the use of a coupling layer to promote synthetic antiferromagnetism with a second low reluctance liner layer.

In this situation, rather than using an antiferromagnet film to pin the undesired liner material, we disclose a method whereby an artificial, or synthetic antiferromagnet is created by depositing a coupling film 110 followed by a second magnetic film 120 that may be the same material as film 60. The coupling film material is chosen from the set of materials including Ru, Os, TaN, Re, Cr, CrMo, and similar, such that, at proper thickness, a strong antiferromagnetic exchange coupling is induced between the original magnetic liner film 60 and the second magnetic film 120. Thus, the directions of magnetization in layers 60 and 120 are oppositely aligned, and the exchange coupling is so strong that currents in the write wire will not induce a significant magnetic moment in the synthetic antiferromagnet trilayer. This effectively removes the trilayer from the low-reluctance magnetic circuit. If anisotropic deposition of the coupling layer 110 and, optionally, the top magnetic layer 120 are utilized, one can ensure that only the horizontal surfaces are affected. FIG. 7 represents the case where anisotropic deposition is used for the coupling layer 110 only.

The demagnetization field of the long wire will make the preferred alignment of these two layers 60 and 120 along the long dimension of the wire (i.e., into or out of the page). The specific direction is unknown unless an intentional unbalance is applied to the film, typically by making one of the layers 60 or 120 slightly thicker than the other, or of different materials with different magnetization. Then, a strong field can be applied to set the magnetization of all wires in the same, manufacturer-preferred, direction, and the advantages of knowing the offset fields can be realized in this scheme as in the one previously discussed.

Figure 8:
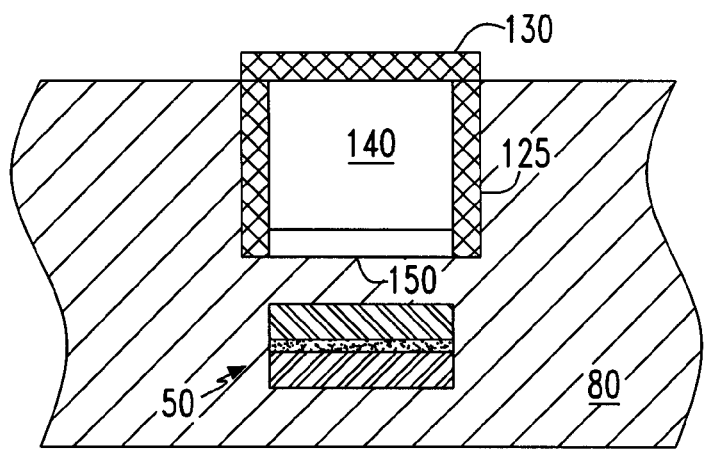
FIG. 8 shows the final structure created using methods of FIG. 5, 6, or 7, after final processing.

The final processing steps to complete the liner are included in the final structure shown in FIG. 8. In each of the methods described in FIGS. 5, 6, and 7, the next step after removing the horizontal surfaces" contribution to the low-reluctance circuit would be the optional deposition of a diffusion barrier such as TiN, TaN, Ta, Ru, or some combination of these.

This is followed with a Damascene process where copper is deposited and plated to a thickness exceeding the depth of the trench. The copper is then chemically-mechanically polished (CMP"ed) to remove all copper above the horizontal surface of the liner (or diffusion barrier) on top of the dielectric 80. A second (or extended first) CMP step is used to remove the diffusion barriers and magnetic materials still remaining on top of dielectric 80, thus electrically isolating individual wires from each other. A final electroless plating step can be used to cap the exposed copper 140 with a low-reluctance film such as CoWP, item 130 in the figure. Preferably, the cap layer has a clean, gently curving interface with the sides, so that the magnetic flux will be best contained. It is an advantageous feature of the invention that magnetic fields can pass through a slight gap, so that the magnetic connection (or magnetic contact) between the cap and the sides need not be perfect. As represented in the figure, liner layer 150 is now a deactivated portion of the low-reluctance magnetic circuit. Having been deactivated by one of the methods disclosed in this invention, the lower portion of the liner no longer shunts magnetic flux, and we are left with the desired upside-down horseshoe shaped liner.

The method of forming a magnetic cell according to the invention may be summarized as: Provide a semiconductor wafer and form transistors in it to construct logic circuits and Input/Output modules for data; form an array of magnetic sensing elements in locations for an array of magnetic cells; deposit a supporting dielectric around the sensing elements; form a corresponding array of trenches for write elements; deposit a low-reluctance magnetic concentrating material on the bottom and sides of the trenches; disable the magnetic concentrating material on the bottom of the trenches; deposit a conductor in the trenches; and deposit a cap of magnetic concentrating material on the top of the conductor forming a low reluctance path connecting the two sides and the top of the write element.

Conventional back end steps provide: a) connections to the write elements that respond to the address of a cell to be written to apply a write current to that cell; and b) connections to the sensing elements that respond to the address of a cell to be read from to connect the cell to a sense amplifier or other readout unit.

The step of disabling the magnetic concentrating material may be effected or carried out by: a) damaging the material by bombarding it with particles; b) changing the chemical composition of the material in that area to one that does not have low reluctance; c) pinning the material by depositing a magnetic layer that pins the magnetic concentrating material; or d) constructing a trilayer antiferromagnet that prevents the magnetic material from responding to fields generated by the write element.

Figure 9:
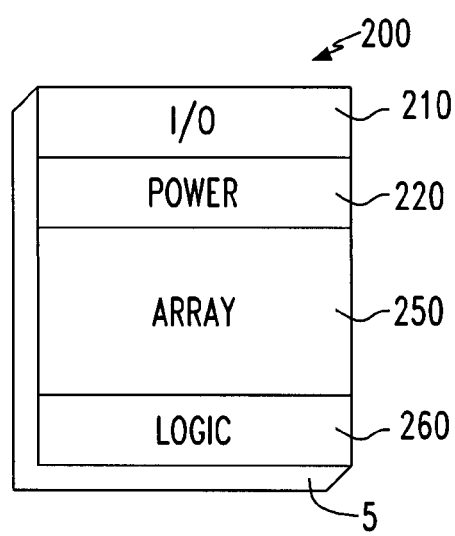
FIG. 9 shows a top view of an integrated circuit constructed using the invention.

FIG. 9 shows a top view of an integrated circuit 200 employing the invention, in which substrate 5 may be any semiconductor, such as bulk silicon, silicon on insulator, silicon-germanium alloy (SiGe), germanium and the like.

Block 210 indicates schematically conventional input/output circuits for receiving data, directing the data to the correct location and delivering data to output pins.

Block 220 indicates schematically power generation and distribution circuitry that generates voltage levels and directs currents to various locations. For example, the write current may be at a different voltage than is used for logic or other circuitry and will need to be directed to the appropriate cell to write data into the cell. Similarly, many kinds of memory cell need to pass a sensing current through the memory sensing unit 50. This sensing current must also be directed to the right location.

The state of a cell may be determined by a sense amplifier connected to the cell and to a reference unit, or by any other convenient means.

Block 250 represents an array of memory cells according to the invention. The array may fill the chip in the case of a specialized memory chip or it may be a small part of a chip primarily performing some function other than memory.

Block 260 represents a logic unit that may be a general purpose computer, a micro-controller, custom system on a chip or any other set of logic modules that carry out some data processing function.

Those skilled in the art will be aware that many modifications may be made to the examples given above. Different types of magnetic sensing units may be used. Similarly, the conductor may be copper, as illustrated or it may be aluminum or any other material that the chip designer finds suitable.

For simplicity in exposition, details of the fabrication of logic transistors and/or the interconnections between transistors and memory cells that are used to define the circuit have been omitted, as they are well known to those skilled in the art. The term "preparing the substrate" will be used as a shorthand expression for the steps of forming transistors (CMOS or bipolar) in the substrate and forming the lower levels of interconnections. Similarly, the term "completing the circuit" will be used as a shorthand expression for the steps of forming the various levels of interconnections, pad layers, input output contacts and the like.

While the invention has been described in terms of a single preferred embodiment, those skilled in the art will recognize that the invention can be practiced in various versions within the spirit and scope of the following claims.

The invention claimed is:

1. A method of forming a magnetic memory cell comprising the steps of:
   forming a magnetic sensing element;
   depositing an interlayer dielectric about said magnetic sensing element and forming an aperture for a write element in said interlayer dielectric, said aperture having an aperture axis oriented with respect to said magnetic sensing element and being located above said magnetic sensing element;
   depositing a liner layer of a first magnetic concentrating material within said aperture, said liner layer having a bottom portion facing said sensing element, and two connecting sides on vertical sides of said aperture, said first magnetic concentrating material having a reluctance below a reluctance threshold;
   disabling said first magnetic concentrating material in said bottom portion; and depositing a conductor within said aperture, whereby magnetic fields generated by a current in said conductor are concentrated by said first magnetic concentrating material on said connecting sides and directed toward said magnetic sensing element.

2. A method according to claim 1, in which said step of disabling raises the value of the reluctance of said first magnetic concentrating material on said bottom portion above said reluctance threshold, whereby magnetic flux in said connecting sides is directed downward toward said magnetic sensing element.

3. A method according to claim 2, in which said step of disabling is effected by implanting a substance in said bottom portion of said first magnetic concentrating material.

4. A method according to claim 3, in which said step of disabling is effected by implanting ions from the group comprising oxygen, argon, xenon, krypton, carbon, fluorine, boron, phosphorus, arsenic, germanium, gallium, indium, and nitrogen.

5. A method according to claim 2, in which said step of disabling is effected by implanting particles in said bottom portion of said first magnetic concentrating material that destroy the crystal structure of said first magnetic concentrating material.

6. A method according to claim 1, in which said step of disabling is effected by depositing a layer of pinning material that pins said first magnetic concentrating material in said bottom portion.

7. A method according to claim 6, in which said step of depositing a layer of pinning material comprises depositing said pinning material anisotropically such that the pinning material on said bottom portion is sufficiently thick to pin said layer of first magnetic concentrating material in said bottom portion and the pinning material on said connecting sides has a thickness below a pinning thickness threshold, whereby said first magnetic concentrating material on said connecting sides is not pinned.

8. A method according to claim 6, in which said step of depositing a layer of pinning material is performed before said step of depositing said first magnetic concentrating material.

9. A method according to claim 6, in which said step of depositing a layer of pinning material is performed after said step of depositing said first magnetic concentrating material.

10. A method according to claim 1, in which said step of disabling is effected by depositing a trilayer antiferromagnet comprising said first magnetic concentrating material, a coupling layer and a second magnetic concentrating material, whereby said trilayer antiferromagnet does not respond substantially to current in said write element.

11. A method according to claim 1, further comprising a step of depositing a top layer of a second magnetic concentrating material on a top surface of said conductor and in magnetic contact with said connecting sides, whereby magnetic flux generated by current in said conductor flows preferentially within said top layer and said connecting sides, thereby increasing magnetic field applied to said magnetic sensing element by said current in said conductor.

12. A method of forming an integrated circuit having an array of magnetic memory cells comprising the steps of:
   preparing a semiconductor substrate;
   forming said array of magnetic memory cells by forming a set of magnetic sensing elements in said array of cells;
   depositing an interlayer dielectric about said magnetic sensing elements and forming a set of apertures for a write element in said interlayer dielectric, said apertures having an aperture axis oriented with respect to said magnetic sensing elements and being located above said magnetic sensing elements;
   depositing a liner layer of a first magnetic concentrating material within said apertures, said liner layer having bottom portions facing said sensing elements, and two connecting sides on vertical sides of said apertures, said first magnetic concentrating material having a reluctance below a reluctance threshold;
   disabling said first magnetic concentrating material in said bottom portions; and depositing conductors within said apertures, whereby magnetic fields generated by currents in said conductors are concentrated by said first magnetic concentrating material on said connecting sides and directed toward said magnetic sensing elements.

13. A method according to claim 12, in which said step of disabling raises the value of the reluctance of said first magnetic concentrating material on said bottom portion above said reluctance threshold, whereby magnetic flux in said connecting sides is directed downward toward said magnetic sensing element.

14. A method according to claim 13, in which said step of disabling is effected by implanting a substance in said bottom portion of said first magnetic concentrating material.

15. A method according to claim 14, in which said step of disabling is effected by implanting ions from the group comprising oxygen, argon, xenon, krypton, carbon, fluorine, boron, phosphorus, arsenic, germanium, gallium, indium, and nitrogen.

16. A method according to claim 13, in which said step of disabling is effected by implanting particles in said bottom portion of said first magnetic concentrating material that destroy the crystal structure of said first magnetic concentrating material.

17. A method according to claim 13, in which said step of disabling is effected by depositing a layer of pinning material that pins said first magnetic concentrating material in said bottom portion.

18. A method according to claim 17, in which said step of depositing a layer of pinning material comprises depositing said pinning material anisotropically such that the pinning material on said bottom portion is sufficiently thick to pin said layer of first magnetic concentrating material in said bottom portion and the pinning material on said connecting sides has a thickness below a pinning threshold, whereby said first magnetic concentrating material on said connecting sides is not pinned.

19. A method according to claim 17, in which said step of depositing a layer of pinning material is performed before said step of depositing said first magnetic concentrating material.

20. A method according to claim 17, in which said step of depositing a layer of pinning material is performed after said step of depositing said first magnetic concentrating material.

21. A method according to claim 12, in which said step of disabling is effected by depositing a trilayer antiferromagnet comprising said first magnetic concentrating material, a coupling layer and a second magnetic concentrating material, whereby said trilayer antiferromagnet does not respond substantially to current in said write element.

22. A method according to claim 12, further comprising a step of depositing a top layer of a second magnetic concentrating material on a top surface of said conductor and in magnetic contact with said connecting sides, whereby magnetic fields generated by current in said conductor flow preferentially within said top layer and said connecting sides, thereby increasing magnetic field applied to said magnetic sensing element by said current in said conductor.

* * * * *